United States Patent
Monnerie et al.

(10) Patent No.: US 10,324,117 B2
(45) Date of Patent: Jun. 18, 2019

(54) MONITORING POWER CONSUMPTION BY ELECTRICAL DEVICES USING MONITORED OPERATIONAL PARAMETERS

(71) Applicant: Landis+Gyr Innovations, Inc., Alpharetta, GA (US)

(72) Inventors: Emmanuel Monnerie, Cumming, GA (US); Patrick Melet, Marietta, GA (US); Ruben Emilio Salazar Cardozo, Johns Creek, GA (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 694 days.

(21) Appl. No.: 14/263,297

(22) Filed: Apr. 28, 2014

(65) Prior Publication Data
US 2015/0309095 A1    Oct. 29, 2015

(51) Int. Cl.
*G01R 21/00*   (2006.01)
*G01R 21/06*   (2006.01)
(Continued)

(52) U.S. Cl.
CPC .......... *G01R 21/133* (2013.01); *G01D 4/004* (2013.01); *Y02B 70/3266* (2013.01);
(Continued)

(58) Field of Classification Search
CPC .............................. G01R 21/133; G01D 4/004
(Continued)

(56) References Cited

U.S. PATENT DOCUMENTS

| | | | |
|---|---|---|---|
| 8,527,105 B1 * | 9/2013 | Choong | G01D 4/004 315/294 |
| 2008/0234953 A1 * | 9/2008 | Ignowski | G06F 1/206 702/60 |

(Continued)

FOREIGN PATENT DOCUMENTS

| | | |
|---|---|---|
| GB | 2073455 | * 10/1981 |
| JP | 2010169567 | 8/2010 |

(Continued)

OTHER PUBLICATIONS

PCT/US2015/024654, "International Search Report and Written Opinion", dated Jul. 7, 2015, 11 pages.
(Continued)

*Primary Examiner* — Michael P Nghiem
(74) *Attorney, Agent, or Firm* — Kilpatrick Townsend & Stockton LLP (57) ABSTRACT

Systems and methods are disclosed for monitoring power consumption by electrical devices. In some aspects, a computing device can detect a change in aggregate electricity usage at a monitored environment that includes multiple electrical devices. The computing device can determine that electricity usage by one of the electrical devices has changed. The computing device can determine that the change in electricity usage has occurred based on a change in a monitored operational parameter other than electrical power provided to the electrical device. The value of the monitored operational parameter can change based on an operation performed by the electrical device when using electricity. The computing device can determine how electricity is used by the electrical device by correlating the change in the aggregate electricity usage and the change in the electricity usage by the electrical device.

24 Claims, 4 Drawing Sheets

(51) Int. Cl.
*G01R 21/133* (2006.01)
*G01D 4/00* (2006.01)

(52) U.S. Cl.
CPC .......... *Y02B 90/242* (2013.01); *Y02B 90/245* (2013.01); *Y04S 20/242* (2013.01); *Y04S 20/322* (2013.01); *Y04S 20/38* (2013.01); *Y04S 20/40* (2013.01)

(58) Field of Classification Search
USPC .......................................................... 702/60
See application file for complete search history.

(56) References Cited

U.S. PATENT DOCUMENTS

| | | | | |
|---|---|---|---|---|
| 2010/0292961 | A1* | 11/2010 | Moss | G01D 4/002 702/188 |
| 2011/0301894 | A1 | 12/2011 | Sanderford et al. | |
| 2012/0143540 | A1* | 6/2012 | Chen | G01D 4/004 702/62 |
| 2012/0278272 | A1 | 11/2012 | Kim et al. | |
| 2013/0215933 | A1* | 8/2013 | Young | H04Q 9/00 375/145 |
| 2013/0338948 | A1* | 12/2013 | Zeifman | G01D 4/002 702/60 |
| 2014/0003180 | A1* | 1/2014 | Matsuda | G01R 21/00 365/226 |
| 2015/0097693 | A1* | 4/2015 | Shudark | G01D 4/002 340/870.02 |
| 2016/0146153 | A1* | 5/2016 | Hesselink | F02B 63/043 290/2 |

FOREIGN PATENT DOCUMENTS

| | | |
|---|---|---|
| JP | 2011254586 | 12/2011 |
| JP | 2013528876 | 7/2013 |
| WO | 2012130509 | 10/2012 |
| WO | 2013073094 | 5/2013 |
| WO | 2015167761 | 11/2015 |

OTHER PUBLICATIONS

PCT/US2015/024654, "International Preliminary Report on Patentability", dated Nov. 10, 2016, 9 pages.
Mexican Patent Application No. MX/A/2016/013740, "Office Action", dated Aug. 28, 2018, English Translation (Redacted), 6 pages.
Japanese Application No. 2016-565054, Office Action dated Jan. 8, 2019, 28 pages (9 pages for the original document and 19 pages for the English translation).

\* cited by examiner

MONITORING POWER CONSUMPTION BY ELECTRICAL DEVICES USING MONITORED OPERATIONAL PARAMETERS

TECHNICAL FIELD

This disclosure relates generally to networking and metering, and more particularly relates to monitoring power consumption by electrical devices using monitored operational parameters.

BACKGROUND

Electrical devices located in homes, dwellings, or other structures consume electricity. Utility companies, consumers, and other individuals or entities may monitor consumption of the electricity by devices within a structure or other environment to which electricity is provided. Monitoring consumption of electricity by consumers in a home may allow a utility company to identify distribution issues and other problems. Monitoring consumption of electricity by consumers in a home may allow to provide information to the consumer that describes individual power consumption by each appliance, thereby allowing the consumer to more effectively manage energy consumption in the home.

In some cases, utility companies or other entities may monitor electricity consumption by individual devices in a home. Current solutions for monitoring electricity consumption involve installing power measurement devices in line with a powered device. A power measurement device may be installed in line with a powered device by connecting a probe, tap, or other conductor of the power measurement device to an electrical terminal of the powered device or to a cable that is used to provide power to the device. The power measurement device determines the electricity consumption by the device by measuring the current flowing through the electrical connection to the device.

Current solutions for monitoring electricity consumption by individual devices may present disadvantages. For example, a power measurement device that is installed in line with a powered device may be difficult to install if an electrical terminal of the device is not conveniently located. Power measurement devices may also have a large physical size. For example, national and international safety standards and other requirements may require electrical devices that contain potentially hazardous electrical energy source to include a housing or other structure with certain protective physical characteristics, which may result in a larger device profile. The larger size of an electrical device may hinder the installation of power measurement sensors in line with an electrical terminal of a powered device. The use of such in-line power measurement devices having a large physical size may also hinder installing other electrical devices in the same location or replacing the monitored electrical device.

It is desirable to monitor power consumption by an electrical device without directly measuring electrical current flowing through an electrical connection to the device.

SUMMARY

Systems and methods are disclosed for monitoring power consumption by electrical devices using monitored operational parameters. In some aspects, a computing device can detect a change in aggregate electricity usage at a monitored environment. The monitored environment can include multiple electrical devices. The aggregate electricity usage can include a combined amount of electricity used by at least some of the electrical devices. The computing device can determine that electricity usage by one of the electrical devices has changed. The computing device can determine that the change in electricity usage has occurred based on a change in a monitored operational parameter (e.g., temperature, vibration, etc.) other than electrical power provided to the electrical device. The value of the monitored operational parameter can change based on an operation performed by the electrical device in response to the electrical device using electricity (e.g., an increase in temperature at the appliance caused by operation of the appliance). The computing device can determine an amount of the electricity usage by the electrical device by correlating the change in the aggregate electricity usage and the change in the electricity usage by the electrical device.

These illustrative aspects and features are mentioned not to limit or define the invention, but to provide examples to aid understanding of the inventive concepts disclosed in this application. Other aspects, advantages, and features of the present invention will become apparent after review of the entire application.

BRIEF DESCRIPTION OF THE FIGURES

These and other features, aspects, and advantages of the present disclosure are better understood when the following Detailed Description is read with reference to the accompanying drawings, where.

DETAILED DESCRIPTION

Systems and methods are provided for monitoring power consumption by electrical devices using monitored operational parameters. Monitored operational parameters can include changes in a physical environment at or near the monitored electrical devices. For example, activating an electrical device or otherwise changing the mode of an electrical device may cause the electrical device to vibrate, emit heat, emit light, or otherwise change the physical environment at or near the electrical device. The changes in the physical environment can be detected by sensors that are attached to the electrical devices or positioned near the electrical devices. The detected changes in the physical environment can be used to determine that detected changes in power consumption are attributable to the monitored electrical devices.

Using such operational parameters can allow power consumption to be monitored without installing a tap or other measuring device in line with a power connection to a powered device. For example, the sensors used to monitor operational parameters such as temperature, vibration, etc. may be positioned at any location suitable for detecting changes in the operational parameter.

In accordance with some aspects, a monitoring system is provided for monitoring power consumption by electrical devices using monitored operational parameters. The monitoring system can include a computing device and multiple monitoring devices that are coupled to or co-located with respective electrical devices in a monitored environment. Non-limiting examples of a monitored environment include a house, an apartment in a multi-dwelling unit, or other structure to which electrical power can be provided. The computing device can detect a change in aggregate electricity usage at a monitored environment. For example, the computing device can include or can be in communication with a metering device that is used to measure power consumption by a house or other structure. The aggregate electricity usage can include a combined amount of electricity used by at least some electrical devices within the monitored environment (e.g., washing machines, televisions, etc.).

The computing device of the monitoring system can also determine that electricity usage by one of the electrical devices has changed. For example, the computing device can be communicatively coupled with the monitoring devices. The computing device can identify operational parameters (e.g., temperature, vibration, etc.) that are monitored by the monitoring devices and the values of the monitored operational parameters. The value of the monitored operational parameter can be controlled at least in part by an operation performed by the electrical device in response to the electrical device using electricity. For example, an operational parameter such as temperature can change in value in response to an appliance being turned on or turned off.

The computing device of the monitoring system can also determine an amount of the electricity usage by the electrical device by correlating the change in the aggregate electricity usage and the change to the monitored operational parameter for the electrical device. For example, the computing device can determine that the change in the aggregate electricity usage occurred at or near the same time as a change in temperature, vibration, heat flux, emitted light, or some other suitable operational parameter of the monitored electrical device. The computing device can attribute the change in the aggregate electricity usage to the electrical device based on contemporaneous changes to the aggregate electricity usage and the monitored operational parameter.

The use of monitored operational parameters can obviate the need to use in-line power measurement devices for monitoring electricity consumption by electrical devices. The use of monitoring devices other than in-line power measurement devices can allow for easier installation of other electrical devices in the same location as a monitored electrical device. The use of monitoring devices other than in-line power measurement devices can allow for easier replacement of monitored electrical devices.

The monitoring system can provide the information about electricity usage by different electrical devices to any suitable individual or other entity. In some aspects, the computing device of the monitoring system can output information about the electricity usage to a user in the monitored environment (e.g., the owner of a home or other structure).

Outputting the information may include presenting the information in a graphical interface, transmitting the information to another computing device (e.g., a smart phone, a tablet, etc.), and the like. In other aspects, the computing device of the monitoring system can transmit information about the electricity usage to a utility company. For example, the computing device of the monitoring system may be communicatively coupled to a head-end unit of a power delivery system via a data network. The computing device can transmit information about the electricity usage to the head-end unit via the data network.

These illustrative examples are given to introduce the reader to the general subject matter discussed here and are not intended to limit the scope of the disclosed concepts. The following sections describe various additional aspects and examples with reference to the drawings in which like numerals indicate like elements.

Figure 1:
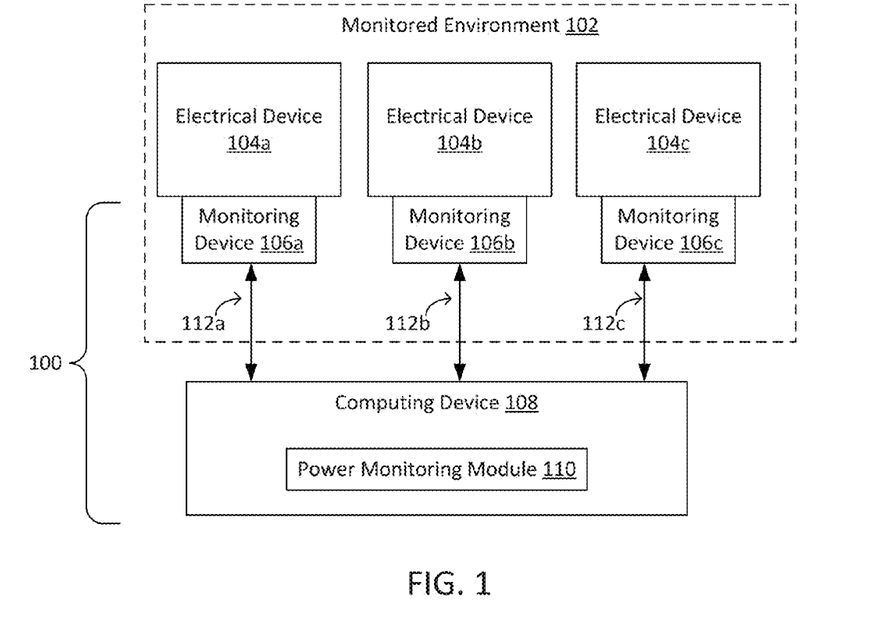
FIG. 1 is a network diagram illustrating an example of a monitoring system that can monitor power consumption in a monitored environment using operational parameters of electrical devices in the monitored environment.

Referring now to the drawings, FIG. 1 is a network diagram illustrating an example of a monitoring system 100 that can monitor power consumption in a monitored environment 102. The monitored environment 102 can include multiple electrical devices 104*a-c*. One or more of the electrical devices 104*a-c* may be devices that consume electrical power to perform one or more mechanical functions or other functions. Non-limiting examples of the monitored environment 102 include a house, a unit of a multi-dwelling unit (e.g., an apartment), or other structure in which the multiple electrical devices 104*a-c* can share a connection to a utility or other power distribution system. Non-limiting examples of the electrical devices 104*a-c* in the monitored environment 102 include a water heater, a pool pump, an air conditioner, user appliances (such as, but not limited to, televisions, washing machines, refrigerators) etc.

The monitoring system 100 can include one or more monitoring devices 106*a-c* and a computing device 108 that can execute a power monitoring module 110. In some aspects, the computing device 108 can include or be communicatively coupled to a utility meter that is attached to or otherwise installed in the monitored environment 102. In some environments, such as an apartment building or other multi-dwelling unit, a computing device 108 or other device servicing a given dwelling may be installed at a location that is remote from the dwelling being serviced. For example, the computing device 108 may be installed in a utility closet at one end of the monitored environment 102 and may service a dwelling at an opposite end of the monitored environment 102.

The computing device 108 can include any suitable device or groups of devices that is configured to monitor power consumption within the monitored environment 102. In some aspects, the computing device 108 can include an intelligent metering device for a power distribution system. The intelligent metering device can monitor and collect information about aggregate power consumption at the monitored environment 102. In other aspects, the computing device 108 can be a separate device that is in communication with an intelligent metering device via a data network. The intelligent metering device can transmit information about the aggregate power consumption at the monitored environment 102 to the computing device 108 via the data network. In some aspects, the computing device 108 can communicate with a server system or other head-end system of the power distribution system via a data network.

The computing device 108 can execute the power monitoring module 110 to communicate with the monitoring devices 106*a-c* via respective communication links 112*a-c*.

The communication links 112a-c can be RF links or other suitable communication links using wireline or wireless communication protocols between the computing device 108 and the monitoring devices 106a-c. Non-limiting examples of suitable wireless communication protocols for establishing the communication links 112a-c include ZIG-BEE®, Wireless Meter-Bus ("M-Bus"), Z-Wave, etc. Non-limiting examples of suitable wireline communication protocols for establishing the communication links 112a-c include HOMEPLUG GREEN PHY™, G3-PLC, PRIME, IEEE 1901.2, etc.

Figure 2:
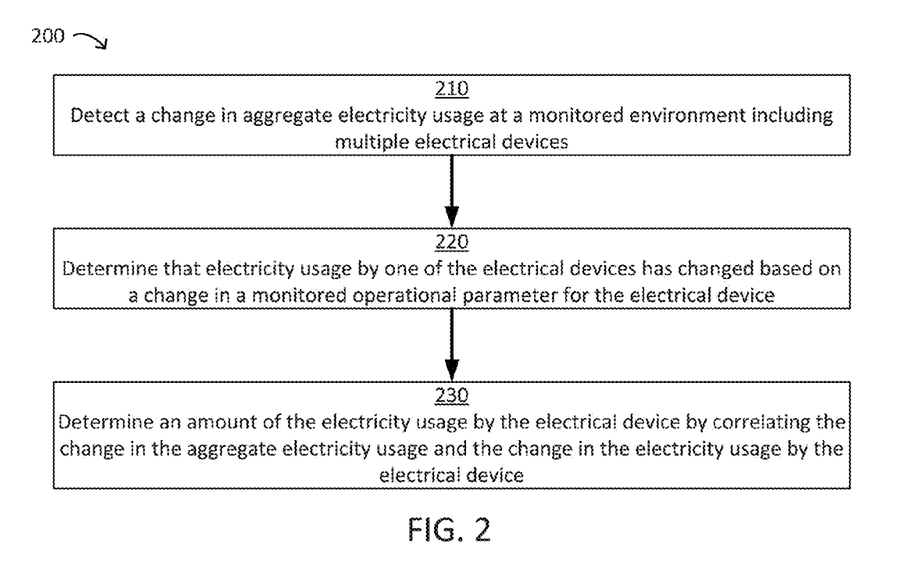
FIG. 2 is a flow chart illustrating an example of a method for monitoring power consumption by electrical devices using monitored operational parameters of the electrical devices.

FIG. 2 is a flow chart illustrating an example of a method 200 for monitoring power consumption by electrical devices 104a-c using monitored operational parameters. For illustrative purposes, the method 200 is described with reference to the system implementation depicted in FIG. 1. Other implementations, however, are possible.

The method 200 involves detecting a change in aggregate electricity usage at a monitored environment 102 that includes electrical devices 104a-c, as shown in block 210. The aggregate electricity usage can be a combined amount of electricity used by at least some of the electrical devices 104a-c. For example, a processing device of the computing device 108 can execute the power monitoring module 110. The power monitoring module 110 can monitor the aggregate electricity usage in the monitored environment 102. The power monitoring module 110 can store data in a suitable computer-readable medium that identifies the aggregate electricity usage over time. The power monitoring module 110 can detect that the aggregate electricity usage has changed by determining that the aggregate electricity usage during a first time period is different than the aggregate electricity usage during a second time period.

The method 200 further involves determining that electricity usage by at least one of the electrical devices 104a-c has changed based on a change in a monitored operational parameter of the electrical device, as shown in block 220. For example, the monitoring devices 106a-c can be coupled to or otherwise co-located with the respective electrical devices 104a-c. Each of the monitoring devices 106a-c can monitor the value of a respective operational parameter for a respective one of the respective electrical devices 104a-c. The monitoring devices 106a-c can provide data indicative of the value of the monitored operational parameter to the computing device 108 or other suitable processing device. The provided data can include an identifier of the monitoring device, thereby allowing the power monitoring module 110 to associate a given value of an operational parameter with a given one of the monitoring device 106a-c.

In some aspects, the data provided by the monitoring devices 106a-c can include respective values for operational parameters that are detected by sensors in the monitoring devices 106a-c. The computing device 108 or other suitable processing device can execute the power monitoring module 110 to compare values for a given operational parameter from different time periods and thereby determine that the value of the given operational parameter has changed. In additional or alternative aspects, one or more of the monitoring devices 106a-c can include a processing device that can identify a change in a monitored operational parameter. The monitoring device can compare values for a given operational parameter from different time periods and thereby determine that the value of the given operational parameter has changed. The monitoring device can transmit a notification to the computing device 108 that the operational parameter has changed. For example, the monitoring device can notify the computing device 108 that a monitored electrical device has been turned on, been turned off, or otherwise experienced a change in its operating mode.

In some aspects, the monitoring devices 106a-c can provide the data indicative of the value of the monitored operational parameter to the computing device 108 continuously (e.g., every minute, every 30 seconds, etc.). In other aspects, the monitoring devices 106a-c can notify the computing device 108 that a change in the state of one or more of the electrical devices 104a-c has occurred (e.g., a device switching on or switching off). Doing so can decrease the amount of data traffic over the communication links 112a-c during periods when no change in state has occurred with respect to the electrical devices 104a-c. In other aspects, the monitoring devices 106a-c can provide the data indicative of the value of the monitored operational parameter to the computing device 108 in response to a query from the computing device 108. In one non-limiting example, the computing device 108 may repeatedly query the monitoring devices 106a-c. In another non-limiting example, the computing device 108 may query the monitoring devices 106a-c in response to detecting a change in the aggregate electricity usage. In another non-limiting example, the monitoring devices 106a-c can communicate with the computing device 108 in response to detecting a change in a monitored parameter. For example, if one of the monitoring devices 106a-c detects a temperature change, the monitoring device may transmit a message to the computing device 108 that describes the temperature change. Transmitting a notification message to the computing device 108 in response to a change in a monitored parameter can reduce power consumption by the monitoring devices 106a-c, which can increase energy efficiency and/or prolong the battery life for the monitoring devices 106a-c.

In some aspects, the monitored operational parameter can include a movement such as a vibration of one or more components of a monitored electrical device. In a non-limiting example, devices such as laundry machines, dishwashers, desktop computers, etc. may emit different amounts of vibration during operation due to the movement of mechanical parts within the electrical devices. A monitoring device can be attached to a device component that emits the vibrations or is affected by the vibrations. For example, a vibration sensor can be attached to an outer surface of a laundry machine or other device that vibrates. The vibration sensor can monitor the amount of vibration.

In additional or alternative aspects, the monitored operational parameter can include a sound or other movement of air that is generated or emitted by one or more components of a monitored electrical device. In a non-limiting example, devices such as televisions, stereos, laundry machines, dishwashers, etc. may emit different amounts of sound or different types of sound during operation. A monitoring device, such as a sound detector, can be attached to the monitored electrical device or otherwise positioned in a location that is suitable for detecting the emitted sounds. The monitoring device can monitor the sound emitted during operation of the monitored electrical device.

In additional or alternative aspects, the monitored operational parameter can include a temperature of a component of the electrical device (e.g., the temperature of an outer housing of the electrical device) or a material adjacent to the electrical device (e.g., the ambient temperature of air around the electrical device). For example, devices such as dryers, air conditioners, computing devices, etc. may emit heat during operation. The emitted heat can change the temperature of components of the electrical device or of materials (such as air) located near the electrical device. A monitoring device such as a temperature sensor can be attached to a component of the monitored electrical device that experiences a change in temperature or can be positioned a location that is suitable for a change in temperature of a material near the electrical device. The monitoring device can monitor the temperature of the device component or the material near the monitored electrical device. In some aspects, the temperature can be monitored using a material adjacent to or otherwise collocated with the electrical device, where the material can conduct heat. Non-limiting examples of such material include conductive solids, liquids, and gases.

In additional or alternative aspects, the monitored operational parameter can include electromagnetic energy emitted by one or more components of the electrical device (e.g., visible light, radio signals, ultraviolet light, infrared radiation, etc.). For example, devices such as lamps, televisions, computing devices, etc. may emit different levels of light during different modes of operation. A monitoring device such as a light sensor can be attached to a component of the monitored electrical device or can be positioned near the electrical device such that the light sensor is in the path of the emitted light. The monitoring device can monitor the light emitted by one or more components of the monitored electrical device.

The method 200 further involves determining an amount of the electricity usage by the electrical device by correlating the change in the aggregate electricity usage and the change in the monitored operational parameter, as shown in block 230. For example, a suitable processing device of the computing device 108 can execute the power monitoring module 110 to monitor the aggregate electricity usage in the monitored environment 102. The power monitoring module 110 can store data in a suitable computer-readable medium that identifies the values of the monitored operational parameter over time. The power monitoring module 110 can correlate the change in the aggregate electricity usage and the change in the monitored operational parameter by, for example, determining that the change in the aggregate electricity usage and the change in the monitored operational parameter occurred within a common time period. The power monitoring module 110 can thereby determine that the change in aggregate electricity usage is attributable to the electrical device based on the correlation. The power monitoring module 110 can determine that the amount by which the aggregate electricity usage has changed corresponds to the electricity usage by the monitored electrical device.

Figure 3:
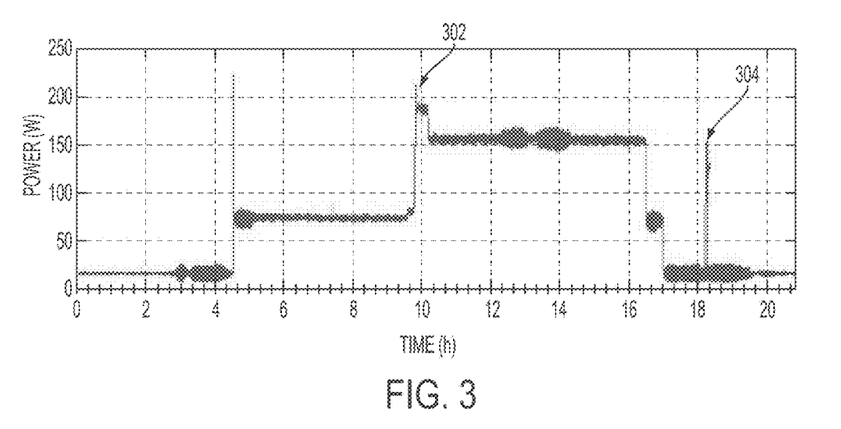
FIG. 3 is a graph depicting aggregate electricity usage in a monitored environment over time.
Figure 4:
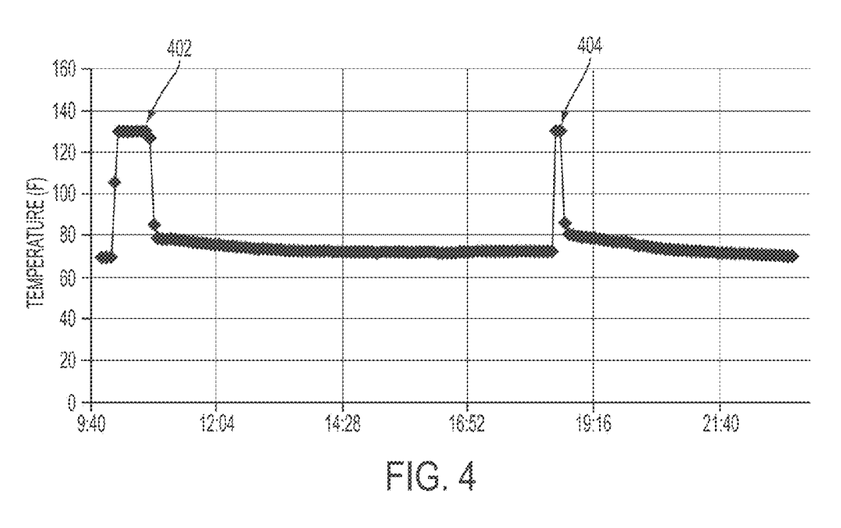
FIG. 4 is a graph depicting the temperature of an electrical device that can be correlated with the aggregate electricity usage depicted in FIG. 3.

FIGS. 3 and 4 depict non-limiting examples of power usage and corresponding temperature changes that can be used by the power monitoring module 110 to determine electricity usage by one of the electrical devices 104a-c.

FIG. 3 is a graph depicting aggregate electricity usage in a monitored environment 102 over time. As depicted in FIG. 3, the power consumed within the monitored environment 102 may change over a period of 24 hours. One change in aggregate electricity usage occurs at time period 302 and another change in the aggregate electricity usage occurs at time period 304.

FIG. 4 is a graph depicting the temperature of one of the electrical devices 104a-c in a monitored environment 102 over time. The data in FIG. 4 can be collected by one of the monitoring devices 106a-c and transmitted to the computing device 108 via a respective one of the communication links 112a-c. The computing device 108 can execute the power monitoring module 110 to determine that increases have occurred in the monitored temperature at time periods 402, 404. For example, one of the monitoring devices 106a-c can detect a temperature change and notify the computing device 108 of the temperature change. The computing device 108 can execute the power monitoring module 110 to correlate the temperature change with variations in aggregate electricity usage. Additionally or alternatively, one of the monitoring devices 106a-c can continually report temperature measurements. The computing device 108 can determine a change between the reported temperature measurements and execute the power monitoring module 110 to correlate the temperature change with variations in aggregate electricity usage. Additionally or alternatively, the computing device 108 can detect a change in aggregate electricity usage. The computing device 108 can query one or more of the monitoring devices 106a-c regarding whether a change in monitored temperature has occurred. Based on the responses from the queried monitoring devices 106a-c, computing device 108 can execute the power monitoring module 110 to correlate the temperature change with variations.

The power monitoring module 110 can determine that the increase in the monitored temperature at time period 402 is correlated with the increase in aggregate electricity usage at time period 302 and that the increase in the monitored temperature at time period 404 is correlated with the increase in aggregate electricity usage at time period 304. Based on the correlation between time periods 302, 402 and the correlation between time periods 304, 404, the power monitoring module 110 can determine that the electricity usage by the monitored electrical device at time periods 302, 304 are the increases in aggregate electricity usage at time periods 402, 404.

In additional or alternative aspects, the power monitoring module 110 can determine degradations in performance by one or more of the electrical devices 104a-c. For example, the power monitoring module 110 can identify and store multiple values of a monitored operational parameter over time that correspond to changes in the electricity usage by an electrical device. The stored values can be associated with respective timestamps. The power monitoring module 110 can determining a degradation in performance of the electrical device based on a difference between the value of the monitored operational parameter over time. For example, changes in the value of the monitored operational parameter over time can indicate different amounts of electricity usage by the monitored electrical device over time. The power management module 110 may determine that a first amount of electricity usage by the electrical device during a first period of time is significantly different from a second amount of electricity usage by the electrical device during a second period of time. Based on the difference in amounts of electricity usage, the power monitoring module 110 can output an alarm or other notification that the electrical device may be malfunctioning or may be nearing the end of its operational life.

In some aspects, the monitoring devices 106a-c can be used to detect potentially hazardous conditions in a home or other structure in which the electrical devices 104a-c are installed. For example, one or more of the monitoring devices 106a-c can monitor temperature at a respective one of the electrical devices 104a-c and determine that the temperature has exceeded a threshold. The monitoring device can transmit an alert to the computing device 108 in response to determining that the temperature has exceeded a threshold. The computing device 108 can respond to the alarm by, for example, notifying an emergency service, activating a fire alarm, etc.

In some aspects, the power monitoring module 110 can distinguish between electrical devices 104a-c that may be switched on or otherwise change their operational mode during the same interval of time. For example, the power monitoring module 110 may determine that two electrical devices 104a, 104b experienced a change in their respective operational parameters during a first time period in which the aggregate electrical usage increased in the monitored environment 102. The power monitoring module 110 may also determine that the electrical device 104a (but not electrical device 104b) experienced a change in its monitored operational parameter (e.g., a drop in temperature) during a second time period in which electrical usage decreased. The power management module 110 can determine from the change in the monitored operational parameter of the electrical device 104a that the electrical device 104a was turned off or otherwise changed its operational mode during the second time period. The power monitoring module 110 can determine that the electricity usage by the electrical device 104a during the first time period corresponds to the amount by which aggregate electricity usage decreased during the second time period. The power monitoring module 110 can also determine that the electricity usage by electrical device 104b during the first time period corresponds to the difference between the amount of electricity usage by the electrical device 104a during the first time period and the amount by which aggregate electricity usage increased during the second time period.

Figure 5:
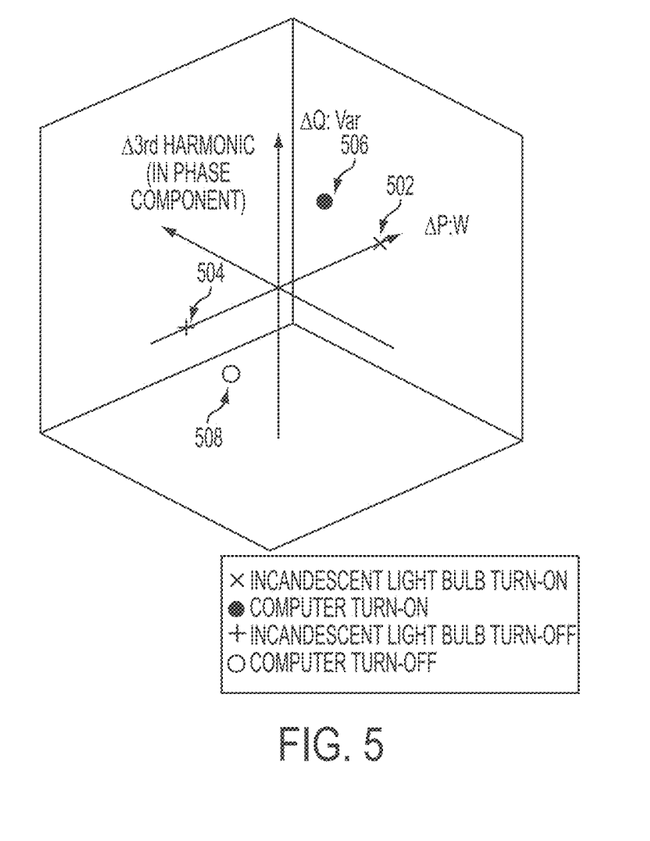
FIG. 5 is a graph depicting changes in the active power, reactive power, and current harmonics corresponding to changes in aggregate electricity usage in a monitored environment.

In additional or alternative aspects, the power management module 110 can distinguish between the operation of different electrical devices 104a-c in the monitored environment 102 by using various power factor characteristics of the aggregate electrical usage. For example, FIG. 5 is a graph depicting changes in the active power, reactive power, and third current harmonic corresponding to changes in aggregate electricity usage in a monitored environment 102. The change in active power (ΔP) caused by changes in aggregate electricity usage at the monitored environment 102 is depicted on a first axis in FIG. 5. The change in reactive power ΔQ caused by changes in aggregate electricity usage at the monitored environment 102 is depicted on a second axis in FIG. 5. The change in the third current harmonic caused by changes in aggregate electricity usage at the monitored environment 102 is depicted on the vertical axis in FIG. 5.

The power management module 110 can correlate changes in aggregate electricity usage to specific electrical devices 104a-c based on known power profiles for the electrical devices 104a-c. For example, the power management module 110 can access data describing a first power profile for a first electrical device (e.g., an incandescent light bulb) and a second power profile for a second electrical device (e.g., a computer). The first power profile can indicate that turning the light bulb on is associated with a positive change in active power and that turning the light bulb off is associated with a negative change in active power. The first power profile can also indicate that turning the light bulb on or off does not change the reactive power or the third current harmonic. The second power profile can indicate that turning the computer on is associated with positive changes in active power, reactive power, and the third current harmonic. The second power profile can also indicate that turning the computer off is associated with negative changes in active power, reactive power, and the third current harmonic.

As depicted in FIG. 5, a change 502 indicates a positive change in active power ΔP for the monitored environment 102 and the absence of a change in the reactive power ΔQ or the third current harmonic for the monitored environment 102. A change 504 indicates a negative change in active power ΔP for the monitored environment 102 and the absence of a change in the reactive power ΔQ or the third current harmonic for the monitored environment 102. The power management module 110 can determine, based on the first power profile that the changes 502, 504 correspond to the behavior of the light bulb (e.g., turning on the light bulb and turning off the light bulb). The power management module 110 can also determine that the light bulb has been turned on or off based on a monitored operational parameter for the light bulb (e.g., changes in light, heat emitted, etc.). The power management module 110 can therefore determine that the changes 502, 504 correspond to changes in power consumed by the light bulb.

The power management module 110 can also determine change in the operational mode of the computer based on the values in FIG. 5. For example, a change 506 indicates positive changes in active power ΔP, reactive power 1Q, and the third current harmonic for the monitored environment 102. A change 508 indicates a negative change in active power ΔP, reactive power ΔQ, and the third current harmonic for the monitored environment 102. The power management module 110 can determine, based on the second power profile that the changes 506, 508 correspond to the behavior of the computer (e.g., turning on the computer and turning off the computer). The power management module 110 can also determine that the computer has been turned on or off based on a monitored operational parameter for the computer (e.g., changes in vibration, temperature, etc.). The power management module 110 can therefore determine that the changes 506, 508 are changes in power consumed by the computer.

Any suitable devices can be used to implement the power monitoring system 100. For example, FIG. 6 is a block diagram that depicts examples of a monitoring device 106 and a computing device 108 that can be used to implement the monitoring system 100 depicted in FIG. 1.

The monitoring device 106 and the computing device 108 can respectively include processors 602, 612. Non-limiting examples of the processors 602, 612 include a microprocessor, a field-programmable gate array ("FPGA") an application-specific integrated circuit ("ASIC"), a state machine, or other suitable processing device. Each of the processors 602, 612 can include any number of processing devices, including one. In some aspects, the processor 602 can be omitted from the monitoring device 106. The processors 602, 612 can be communicatively coupled to computer-readable media, such as memory devices 604, 614. The processors 602, 612 can execute computer-executable program instructions and/or otherwise access information respectively stored in the memory devices 604, 614.

One or both of the memory devices 604, 614 can store instructions that, when executed by the processors 602, 612, cause a respective one of the processors 602, 612 to perform operations described herein. Each of the memory devices 604, 614 may be a computer-readable medium such as (but not limited to) an electronic, optical, magnetic, or other storage device capable of providing a processor with computer-readable instructions. Non-limiting examples of such optical, magnetic, or other storage devices include read-only ("ROM") device(s), random-access memory ("RAM") device(s), magnetic disk(s), magnetic tape(s) or other magnetic storage, memory chip(s), an ASIC, configured processor(s), optical storage device(s), or any other medium from which a computer processor can read instructions. The instructions may comprise processor-specific instructions generated by a compiler and/or an interpreter from code written in any suitable computer-programming language. Non-limiting examples of suitable computer-programming languages include C, C++, C#, Visual Basic, Java, Python, Perl, JavaScript, ActionScript, and the like.

Figure 6:
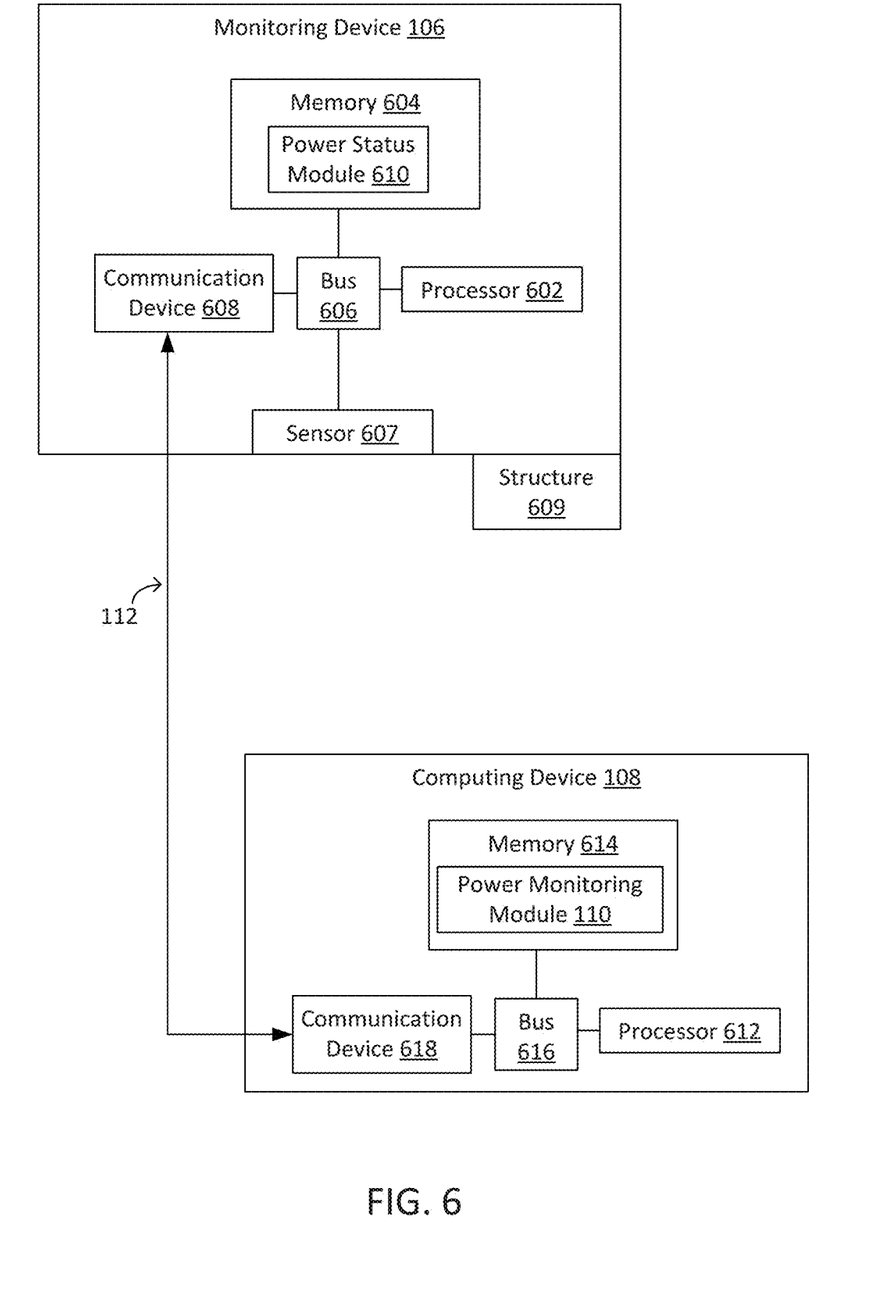
FIG. 6 is a block diagram depicting examples of a monitoring device and a computing device that can be used in the monitoring system depicted in FIG. 1.

The monitoring device 106 and the computing device 108 depicted in FIG. 6 respectively include buses 606, 616. Each of the buses 606, 616 can communicatively couple one or more components of a respective one of the monitoring device 106 and the computing device 108.

Although the processors 602, 612, the memory devices 604, 614, and the buses 606, 616 are respectively depicted in FIG. 6 as separate components in communication with one another, other implementations are possible. For example, the processors 602, 612, the memory devices 604, 614, and the buses 606, 616 can be respective components of respective printed circuit boards or other suitable devices that can be disposed in a monitoring device 106 and/or a computing device 108 to store and execute programming code.

The monitoring device 106 and computing device 108 can also include respective communication devices 608, 618. The communication devices 608, 618 can be configured to establish a communication link 112. Non-limiting examples of the communication devices 608, 618 include power line transceivers, microwave transceivers, Ethernet transceivers, etc.

As depicted in FIG. 6, the monitoring device 106 also includes a sensor 607 that is communicatively coupled to the bus 606, a structure 609 that can be coupled to or integral with a housing of the monitoring device 106, and a power status module 610 stored in the memory device 604. The sensor 607 can monitor an operational parameter of an electrical device. Non-limiting examples of the sensor 607 include a temperature sensor, a vibration sensor, a heat flux sensor, a light sensor, a sound sensor, etc. Although a single sensor 607 is depicted for illustrative purposes, the sensor 607 can include multiple sensors used to detect different operational parameters (e.g., monitoring both vibration and temperature) and/or to detect the same operational parameter at different positions with respect to the monitored electrical device (e.g., detecting a temperature at the surface of the electrical device and an ambient temperature at a short distance away from the electrical device). The power status module 610 can configure the processor 602 to sample, collect, aggregate, process or otherwise use data related to an operational parameter monitored by the monitoring device 106 using the sensor 607.

The structure 609 can include any component or group of components that can be used to couple the monitoring device 106 to an electrical device or to otherwise position the monitoring device 106 at a location suitable for the sensor to measure an operational parameter of the electrical device. Non-limiting examples of the structure 609 include a magnet, an adhesive surface, a bracket, a clamping mechanism, etc.

FIG. 6 also depicts the power monitoring module 110 stored in the memory device 614 of the computing device 108. The processor 612 can execute the power monitoring module 110 to perform one or more operations for monitoring the electricity usage by an electrical device to which the monitoring device 106 is attached or with which the monitoring device 106 is co-located. For example, the power monitoring module 110 can perform the operations described above with respect to method 200.

GENERAL CONSIDERATIONS

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification, discussions utilizing terms such as "processing," "computing," "calculating," "determining," and "identifying" or the like refer to actions or processes of a computing device, such as one or more computers or a similar electronic computing device or devices, that manipulates or transforms data represented as physical electronic or magnetic quantities within memories, registers, or other storage devices, transmission devices, or display devices of the computing platform.

The system or systems discussed herein are not limited to any particular hardware architecture or configuration. A computing device can include any suitable arrangement of components that provide a result conditioned on one or more function calls. Suitable computing devices include multi-purpose microprocessor-based computer systems accessing stored software that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for detecting power consumption by electrical devices from sensors other than an in-line power measurement device, the method comprising:
   monitoring, by a processing device, aggregate electricity usage at a monitored environment, wherein:
     the monitored environment comprises a plurality of electrical devices and a monitoring device that (i) is co-located with an electrical device from the plurality of electrical devices at a position external to a cable providing power to the electrical device and (ii) monitors a value of a monitored operational parameter other than electrical power provided to the electrical device,
     the value of the monitored operational parameter is changed by the electrical device performing an operation in response to the electrical device using electricity, and
     the aggregate electricity usage comprises a combined amount of electricity used by at least some of the plurality of electrical devices;
   identifying, by the processing device and based on a communication from the monitoring device over a data network, a change in the monitored operational parameter, wherein the communication comprises the value of the monitored operational parameter and a notification that the monitoring device has detected the change in the monitored operational parameter;
   determining, by the processing device, that electricity usage by the electrical device has changed based on the change in the monitored operational parameter;
   correlating a change in the aggregate electricity usage with the change in the monitored operational parameter; and
   transmitting data identifying an amount of the electricity usage by the electrical device based on correlating the change in the aggregate electricity usage and the change in the monitored operational parameter.

2. The method of claim 1, wherein the communication is provided from the monitoring device to the processing device in response to the monitoring device detecting the change in the monitored operational parameter.

3. The method of claim 1, wherein the monitored operational parameter comprises a movement associated with the operation of the electrical device.

4. The method of claim 3, wherein the movement comprises a vibration of a component of the electrical device and further comprising using the monitoring device to monitor the vibration.

5. The method of claim 3, wherein the movement comprises a sound or an air movement generated by a component of the electrical device and further comprising using the monitoring device to monitor the sound or air movement.

6. The method of claim 1,
   wherein the monitored operational parameter comprises a temperature of at least one of (i) a component of the electrical device and (ii) a material adjacent to the electrical device, and
   further comprising using the monitoring device to monitor the temperature.

7. The method of claim 6, wherein the monitored operational parameter comprises the temperature of the material adjacent to the electrical device, wherein the material comprises at least one of a solid, a liquid, or a gas that conducts heat.

8. The method of claim 1, wherein the monitored operational parameter comprises electromagnetic energy emitted by a component of the electrical device and further comprising using the monitoring device to monitor the electromagnetic energy, wherein the electromagnetic energy comprises at least one of visible light, radio frequency signals, ultraviolet light, and infrared light.

9. The method of claim 1, wherein correlating the change in the aggregate electricity usage and the change in the monitored operational parameter comprises determining that the change in the aggregate electricity usage and the monitored operational parameter by the electrical device occurred within a common time period.

10. The method of claim 1, further comprising:
    identifying the value of the monitored operational parameter corresponding to the change in the electricity usage by the electrical device;
    identifying an additional value of the monitored operational parameter corresponding to an additional change in the electricity usage by the electrical device;
    determining a degradation in performance of the electrical device based on a difference between the value of the monitored operational parameter corresponding to the change in the electricity usage by the electrical device and the additional value of the monitored operational parameter corresponding to the additional change in the electricity usage by the electrical device; and
    outputting, based on determining the degradation, an alarm indicating a malfunction of the electrical device or a reduction in an operational life of the electrical device.

11. The method of claim 1, further comprising computing the amount of the electricity usage by the electrical device based on correlating the change in the aggregate electricity usage and the change in the monitored operational parameter.

12. The method of claim 11, wherein the change in the aggregate electricity usage comprises a change in aggregate active power and a change in aggregate reactive power, wherein computing the amount of the electricity usage by the electrical device based on correlating the change in the aggregate electricity usage and the change in the monitored operational parameter comprises:

accessing a power profile for the electrical device, wherein the power profile indicates that operating the electrical device causes a combination of (i) positive or negative changes in active power and (ii) positive or negative changes in reactive power;

performing, by the processing device:
(a) a first determination, from the power profile, that the power profile corresponds to a combination of (i) the change in the aggregate active power and (ii) the change in the aggregate reactive power, and
(b) a second determination, from the change in the monitored operational parameter, that the electrical device was operational during a period in which the change in aggregate active power and the change in aggregate reactive power occurred; and attributing, by the processing device and based on the first and second determinations, the change in the aggregate electricity usage to the electrical device.

13. A system comprising:
a processing device;
a monitoring device communicatively coupled to the processing device and co-located with an electrical device from a plurality of electrical devices in a monitored environment, wherein the monitoring device is configured for monitoring a value of a monitored operational parameter other than electrical power provided to the electrical device, wherein the value of the monitored operational parameter is changed by the electrical device performing an operation in response to the electrical device using electricity;
a non-transitory computer-readable medium communicatively coupled to the processing device and storing instructions executable by the processing device; and
a network communication device,
wherein the processing device is configured for executing the instructions to perform operations comprising:
monitoring aggregate electricity usage at the monitored environment, wherein the aggregate electricity usage comprises a combined amount of electricity used by at least some of the plurality of electrical devices,
identifying, based on a communication from the monitoring device over a data network, a change in the monitored operational parameter, wherein the communication comprises the value of the monitored operational parameter and a notification that the monitoring device has detected the change in the monitored operational parameter,
determining that electricity usage by the electrical device has changed based on the change in the monitored operational parameter,
correlating a change in the aggregate electricity usage with the change in the monitored operational parameter, and
causing the network communication device to transmit data identifying an amount of the electricity usage by the electrical device based on correlating the change in the aggregate electricity usage and the change in the monitored operational parameter.

14. The system of claim 13, wherein the monitoring device comprises:
a sensor configured to monitor the monitored operational parameter;
a structure adapted to couple the monitoring device to the electrical device at position suitable for the sensor to monitor the monitored operational parameter, the structure comprising at least one of a magnet, an adhesive surface, a bracket, or a clamping mechanism; and
a communication device configured to communicate data indicative of the value of the monitored operational parameter to the processing device.

15. The system of claim 14, wherein the monitored operational parameter comprises a vibration emitted by the electrical device.

16. The system of claim 14, wherein the monitored operational parameter comprises a sound generated by the electrical device.

17. The system of claim 14, wherein the monitored operational parameter comprises a temperature of the electrical device or adjacent to the electrical device and wherein the structure is further adapted to retain the monitoring device at the position over a range of temperature values.

18. The system of claim 14, wherein the monitored operational parameter comprises electromagnetic energy emitted by the electrical device and wherein the structure is further adapted to couple the monitoring device at the position such that the sensor is in a path traveled by at least some of the electromagnetic energy.

19. The system of claim 13, wherein correlating the change in the aggregate electricity usage and the change in the monitored operational parameter comprises determining that the change in the aggregate electricity usage and the change in the monitored operational parameter occurred within a common time period.

20. The system of claim 13, wherein the processing device is configured for executing the instructions to perform additional operations comprising computing the amount of the electricity usage by the electrical device based on correlating the change in the aggregate electricity usage and the change in the monitored operational parameter.

21. The system of claim 20, wherein the change in the aggregate electricity usage comprises a change in aggregate active power and a change in aggregate reactive power, wherein computing the amount of the electricity usage by the electrical device based on correlating the change in the aggregate electricity usage and the change in the monitored operational parameter comprises:
accessing a power profile for the electrical device, wherein the power profile indicates that operating the electrical device causes a combination of (i) positive or negative changes in active power and (ii) positive or negative changes in reactive power;
performing:
(a) a first determination, from the power profile, that the power profile corresponds to a combination of (i) the change in the aggregate active power and (ii) the change in the aggregate reactive power, and
(b) a second determination, from the change in the monitored operational parameter, that the electrical device was operational during a period in which the change in aggregate active power and the change in aggregate reactive power occurred; and
attributing, based on the first determination and the second determination, the change in the aggregate electricity usage to the electrical device.

22. The system of claim 20, wherein the monitoring device is coupled to a surface of the electrical device via a structure at a location at which the monitoring device detects the monitored operational parameter, the structure comprising at least one of a magnet, an adhesive surface, a bracket, or a clamping mechanism.

23. A non-transitory computer-readable medium storing instructions executable by a processing device, the instructions comprising:

instructions for monitoring aggregate electricity usage at a monitored environment, wherein:
  the monitored environment comprises a plurality of electrical devices and a monitoring device that (i) is co-located with an electrical device from the plurality of electrical devices at a position external to a cable providing power to the electrical device and (ii) monitors a value of a monitored operational parameter other than electrical power provided to the electrical device,
  the value of the monitored operational parameter is changed by the electrical device performing an operation in response to the electrical device using electricity, and
  the aggregate electricity usage comprises a combined amount of electricity used by at least some of the plurality of electrical devices;
instructions for identifying, based on a communication from the monitoring device over a data network, a change in the monitored operational parameter, wherein the communication comprises the value of the monitored operational parameter and a notification that the monitoring device has detected the change in the monitored operational parameter;
instructions for determining that electricity usage by the electrical device has changed based on the change in the monitored operational parameter;
instructions for correlating a change in the aggregate electricity usage with the change in the monitored operational parameter; and
instructions for transmitting data identifying an amount of the electricity usage by the electrical device based on correlating the change in the aggregate electricity usage and the change in the monitored operational parameter.

24. The non-transitory computer-readable medium of claim 23, the instructions further comprising instructions for computing the amount of the electricity usage by the electrical device based on correlating the change in the aggregate electricity usage and the change in the monitored operational parameter, wherein the change in the aggregate electricity usage comprises a change in aggregate active power and a change in aggregate reactive power, wherein computing the amount of the electricity usage by the electrical device based on correlating the change in the aggregate electricity usage and the change in the monitored operational parameter comprises:
  accessing a power profile for the electrical device, wherein the power profile indicates that operating the electrical device causes a combination of (i) positive or negative changes in active power and (ii) positive or negative changes in reactive power;
  performing:
    (a) a first determination, from the power profile, that the power profile corresponds to a combination of (i) the change in the aggregate active power and (ii) the change in the aggregate reactive power, and
    (b) a second determination, from the change in the monitored operational parameter, that the electrical device was operational during a period in which the change in aggregate active power and the change in aggregate reactive power occurred; and
  attributing, based on the first determination and the second determination, the change in the aggregate electricity usage to the electrical device.

* * * * *